United States Patent
Saito

(10) Patent No.: US 7,402,914 B2
(45) Date of Patent: Jul. 22, 2008

(54) SEMICONDUCTOR DEVICE FEATURING OVERLAY-MARK USED IN PHOTOLITHOGRAPHY PROCESS

(75) Inventor: Hirofumi Saito, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 312 days.

(21) Appl. No.: 11/372,032

(22) Filed: Mar. 10, 2006

(65) Prior Publication Data
US 2006/0202360 A1    Sep. 14, 2006

(30) Foreign Application Priority Data
Mar. 11, 2005   (JP)   ............... 2005-069199

(51) Int. Cl.
H01L 23/544   (2006.01)
(52) U.S. Cl. .................. 257/797; 257/E23.179
(58) Field of Classification Search ......... 257/797, 257/E23.179
See application file for complete search history.

(56) References Cited

U.S. PATENT DOCUMENTS

| | | | | |
|---|---|---|---|---|
| 6,083,807 A | * | 7/2000 | Hsu | ............... 438/401 |
| 6,165,656 A | * | 12/2000 | Tomimatu | ............... 430/22 |
| 6,316,328 B1 | * | 11/2001 | Komuro | ............... 438/401 |
| 2005/0074945 A1 | * | 4/2005 | Chang | ............... 438/401 |
| 2005/0110012 A1 | * | 5/2005 | Lee et al. | ............... 257/48 |
| 2006/0151890 A1 | * | 7/2006 | Smith et al. | ............... 257/797 |

FOREIGN PATENT DOCUMENTS

JP    2003-31484    1/2003

* cited by examiner

*Primary Examiner*—Trung Dang
(74) *Attorney, Agent, or Firm*—McGinn IP Law Group, PLLC

(57) ABSTRACT

In a semiconductor device, an insulating layer formed on a substrate and a wiring pattern layer is formed on the insulating layer. A lower mark element is defined as a groove formed in the insulating layer, and defines an overlay mark in conjunction with an upper mask element formed in a photoresist pattern coated on the insulating layer for the formation of the wiring pattern layer. The lower mark element features a width falling within a range from approximately 4 to 6 μm, and a depth of at most 1 μm.

20 Claims, 9 Drawing Sheets

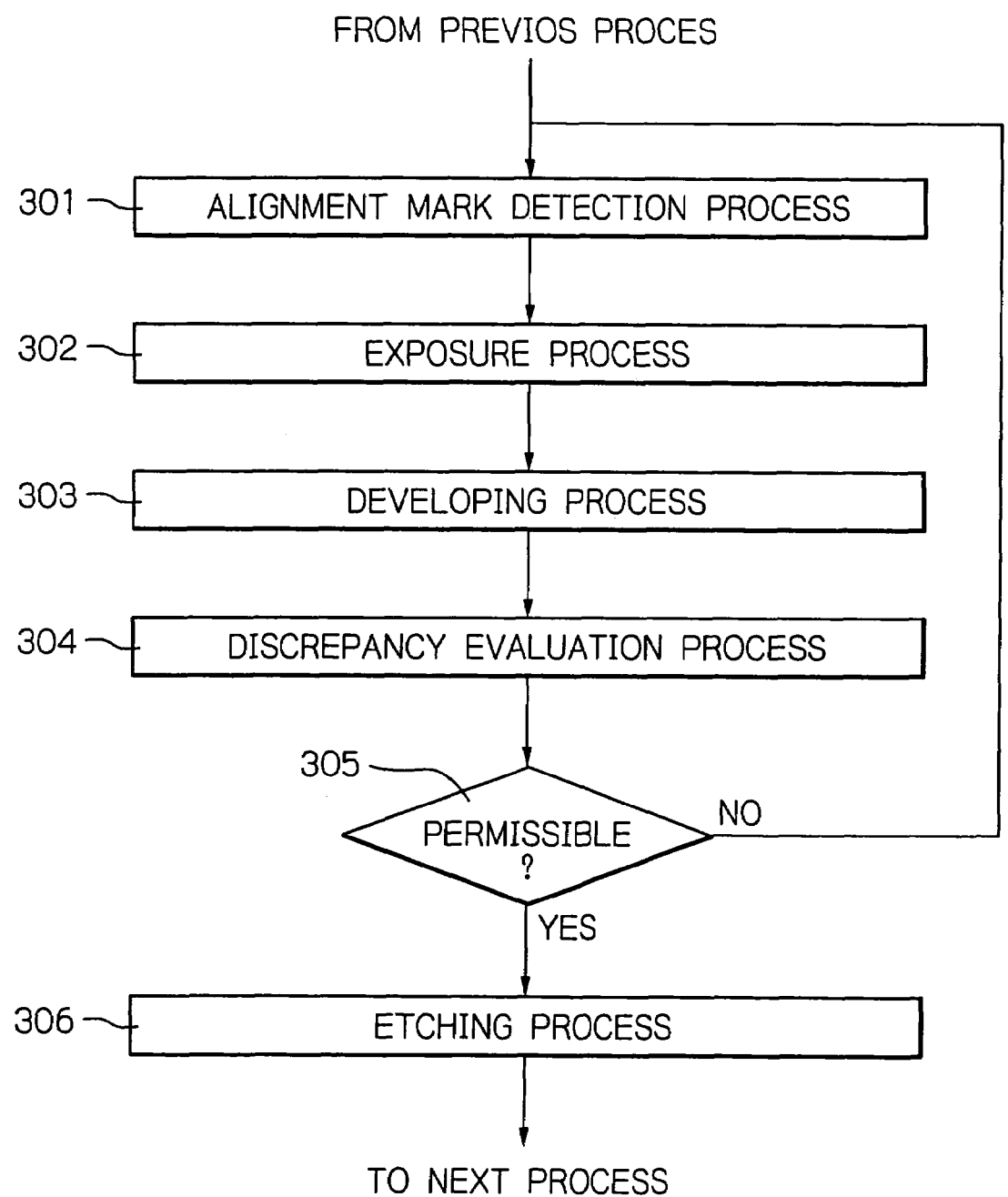

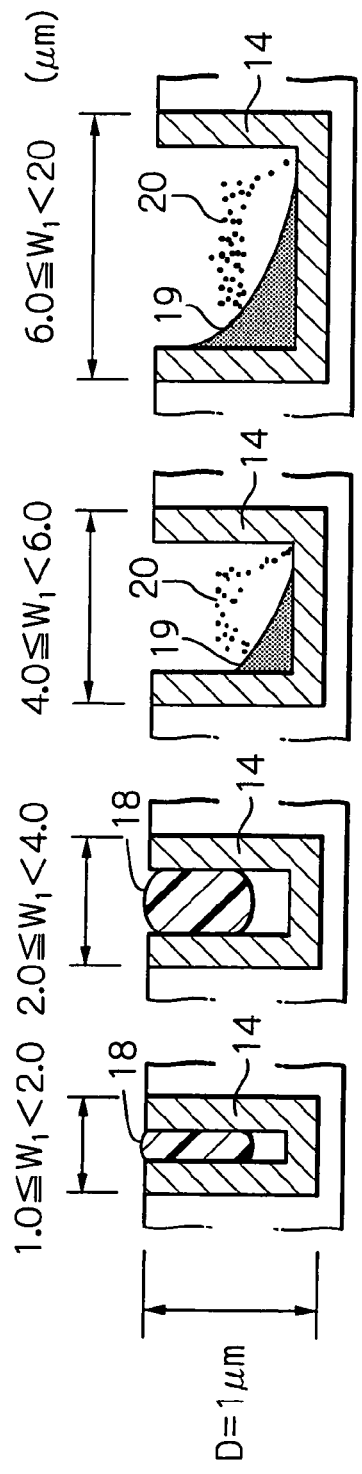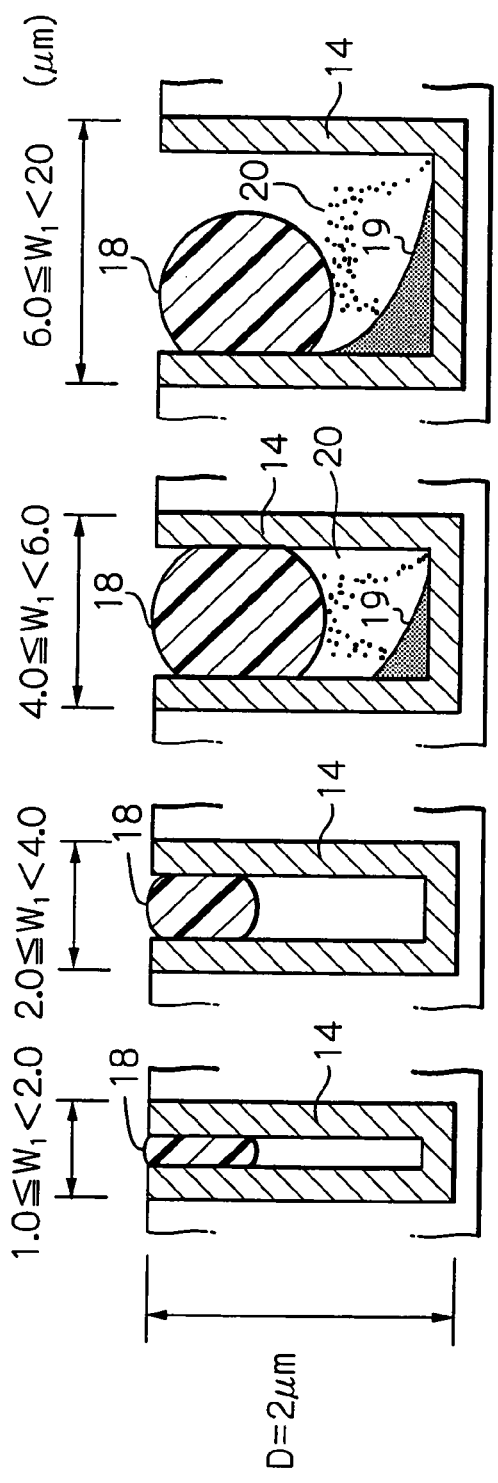

SEMICONDUCTOR DEVICE FEATURING OVERLAY-MARK USED IN PHOTOLITHOGRAPHY PROCESS

BACKGROUND OF THE INVENTION

1. Field of the Invention

The present invention relates to a semiconductor device featuring an overlay mark used in a photolithography process for forming a multi-layered wiring structure on a substrate.

2. Description of the Related Art

In a method for manufacturing a semiconductor device, a semiconductor substrate such as a monocrystalline silicon substrate (wafer) is prepared, and various semiconductor elements, such as transistors, resistors, capacitors and so on, are formed in the semiconductor substrate by using various well-known processes. Then, a multi-layered wiring structure is constructed over the semiconductor substrate.

In particular, first, an insulating layer such as a silicon dioxide layer, which defines a part of the multi-layered wiring structure, is formed on the semiconductor substrate by using a suitable chemical vapor deposition (CVD) process, and a plurality of via holes are formed in the insulating layer to obtain electrical contacts with the various semiconductor elements. Then, a suitable metal material such as a tungsten material is deposited on the silicon dioxide layer by using a sputtering process, to thereby form a tungsten layer on the insulating layer so that the via holes are completely stuffed with the tungsten material.

Next, the tungsten layer is polished by using a chemical mechanical polishing process (CMP) so as to be removed from the top surface of the insulating layer, and thus the tungsten materials, with which the via holes are stuffed, remain as tungsten via plugs electrically connected to the semiconductor elements which are formed in the substrate. Then, a suitable metal material such as an aluminum material is deposited on the top surface of the insulating layer by using a sputtering process, to thereby form an aluminum layer on the insulating layer so as to be in electrical contact with the tungsten via plugs.

Next, a photoresist layer is coated on the aluminum layer by using a spin-coat process, and then the semiconductor device (wafer) is transferred to a stepper including an alignment mark detection apparatus and an optical exposure apparatus. First, the semiconductor device (wafer) is set in the alignment mark detection apparatus, and an alignment mark element, which is previously formed on the semiconductor substrate, is optically detected, and a position of the detected alignment mark element is calculated as positional data with respect to a suitable coordinate system defined on the semiconductor substrate.

Next, the semiconductor device (wafer) is set in the optical exposure apparatus, which includes an optical projector unit having a photomask or reticle for generating a wiring pattern image, and a movable stage associated with the optical projector unit. In the optical exposure apparatus, the semiconductor device (wafer) is placed on the movable stage, and is positioned with respect to the optical projector unit based on the positional data obtained by the alignment mark detection apparatus. Then, an exposure process is carried out such that the wiring pattern image is optically projected on the photoresist layer on the photoresist semiconductor device (wafer) with an ultraviolet ray, by using the photomask or reticle.

After the exposure process is completed, the exposed photoresist layer is subjected to a developing process in which the photoresist layer is defined as a photoresist mask for transfer the wiring pattern image to the aluminum layer on the semiconductor substrate. At this time, although the photoresist mask should be precisely positioned with respect to an arrangement of the tungsten via plugs due to the aforesaid positional data of the alignment mark element, in reality, a discrepancy may be produced between the wiring pattern image and the arrangement of the tungsten via plugs.

Accordingly, after the developing process is completed, the discrepancy between the wiring pattern image and the arrangement of the tungsten via plugs is optically detected, and it is evaluated whether the discrepancy falls within a permissible range. To this end, an overlay mark including a lower mark element and an upper mark element is utilized, as disclosed in, for example, JP-2003-031484-A.

In particular, the lower mark element is defined as a groove formed in the insulating layer, and the groove usually has a square frame configuration when viewed from a location above the top surface of the insulating layer. The formation of the lower mark element in the insulating layer is simultaneously carried out when the tungsten via plugs are formed in the insulating layer, and thus the inner wall faces of the lower mark element are covered with the tungsten layer.

On the other hand, the upper mark element is defined as a square opening formed in the photoresist layer at an area encompassed by the lower mark element. The formation of the upper mark element in the photoresist layer is carried out by the exposure and developing processes. That is, the photomask or reticle has an image corresponding to the upper mark element.

The discrepancy is evaluated as a difference between the center of the lower mark element and the upper mark element.

SUMMARY OF THE INVENTION

During the above-mentioned CMP process, the tungsten layer is polished by using an aqueous abrasive slurry. Thus, when the CMP process is completed, the top surface of the insulating layer is polluted with the residual abrasive slurry, and a part of the residual abrasive slurry is stuffed into the lower mark element or square frame groove. The residual abrasive slurry contains various substances, such as abrasives, silicon-dioxide crumbs, organic crumbs and so on.

Thus, after the completion of the CMP process, the insulating layer is washed with a suitable aqueous washing solution, and is then rinsed with pure water. Nevertheless, a part of the stuffed abrasive slurry may be left in the lower mark element or square frame groove. Especially, when the square frame groove is clogged with the organic crumbs, the clogged organic crumbs may exert a bad influence on the evaluation of the discrepancy between the lower mark element and the upper mark element.

Conventionally, it has been proposed that the clogged organic crumbs are carbonized by using an $O_2$-plasma ashing process, and that the carbonized organic crumbs are washed out with a suitable solvent solution. However, the addition of these processes are inexpedient because it results in an increase in production cost of the semiconductor devices.

In accordance with a first aspect of the present invention, there is provided a semiconductor device wherein an insulating layer is formed on a substrate, and a wiring pattern layer is formed on the insulating layer. Also, a lower mark element is defined as a groove formed in the insulating layer, and the lower mark element defines an overlay mark in conjunction with an upper mask element formed in a photoresist pattern coated on the insulating layer for the formation of the wiring pattern layer. The lower mark element or groove features a width falling within a range from approximately 4 to 6 µm, and a depth of at most 1 µm.

The groove may have a polygonal frame configuration when viewed from a location above a top surface of the insulating layer. Preferably, the polygonal frame configuration is defined as a square frame configuration. The groove may be an incomplete square frame configuration when viewed from a location above a top surface of the insulating layer. Further, the groove may have either a circular frame configuration or an incomplete circular frame configuration when viewed from a location above a top surface of the insulating layer.

In the semiconductor device, a metal layer may be further formed on inner wall faces of the groove so that the width of the groove are narrowed due to a thickness of the metal layer, with the narrowed groove falling within a range from approximately 3 to 5 µm. The metal layer may be composed of one of tungsten (W), tungsten (W) alloy, copper (Cu), copper (Cu) alloy, tantalum (Ta), tantalum (Ta) alloy phosphorus-doped polycrystalline silicon and so on.

Further, another metal layer may be formed on a top surface of the insulating layer so that the narrowed groove is traversed with the other metal layer, and the other metal layer may be composed of one of aluminum (Al), copper (Cu), titanium (Ti) and so on.

In accordance with a second aspect of the present invention, there is provided a semiconductor device wherein an insulating layer is formed on a substrate, and a lower mark element is defined as a groove formed in the insulating layer. In this second aspect, a metal layer is formed on the insulating layer, and a photoresist pattern is formed on the metal layer. Further, an upper mark element is defined as an opening formed in the photoresist layer, and both the lower mark element and the upper mark element defines an overlay mark in conjunction with each other. The lower mark element features a width falling within a range from approximately 4 to 6 µm, and a depth of at most 1 µm.

The lower mark element of groove may be traversed with the metal layer so that the width of the groove are narrowed due to a thickness of the metal layer, with the narrowed groove falling within a range from approximately 3 to 5 µm.

BRIEF DESCRIPTION OF THE DRAWINGS

The present invention will be more clearly understood from the description set forth below, with reference to the accompanying drawings, wherein:

FIG. 3 is a flowchart of the process executed in the stages of FIGS. 1E and 1F;

FIGS. 5A to 5H are partial cross-sectional views visually and representatively showing by way of example the experimental results of FIG. 4;

DESCRIPTION OF THE PREFERRED EMBODIMENTS

With reference to FIGS. 1A through 1F, a method for forming a lower mark element in an embodiment of the semiconductor device according to the present invention is explained below.

Figure 1A:
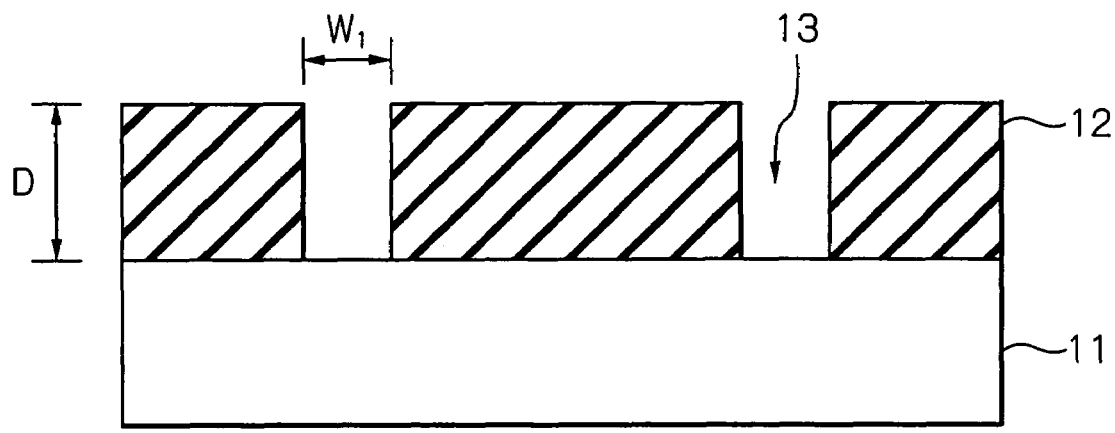
FIGS. 1A through 1F are partial cross-sectional views for explaining the representative stages of a method for forming a lower mark element in an embodiment of the semiconductor device according to the present invention.

First, referring to FIG. 1A, reference 11 indicates a semiconductor substrate such as a monocrystalline silicon substrate (wafer). In FIG. 1A, only one part of the semiconductor substrate 11, in which the lower mark element should be formed, is illustrated, and various semiconductor elements, such as transistors, resistors, capacitors and so on, are formed in the remaining part or not-illustrated part of the semiconductor substrate 11 using various well-known processes.

After the formation of the semiconductor elements in the semiconductor substrate 11 is completed, a silicon dioxide layer 12 is formed as an insulating layer on the semiconductor substrate 11 by using a suitable chemical vapor deposition (CVD) process. Note that the silicon dioxide layer 12 forms a part of a multi-layered wiring structure to be formed on the semiconductor substrate 11. Then, a groove 13 is formed as the lower mark element in the silicon dioxide layer 12 by using a photolithography and etching process.

Figure 2A:
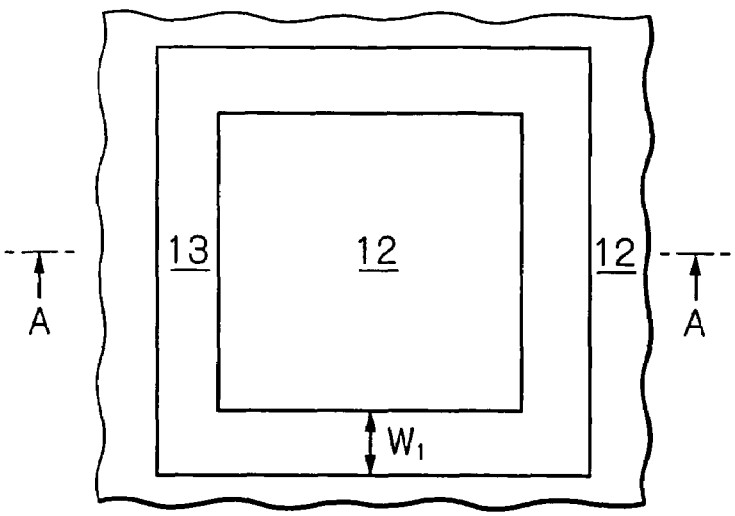
FIG. 2A is a partial plan view of FIG. 1A.

As shown in FIG. 2A, which is a partial plan view of FIG. 1A, the groove 13 has a square frame configuration. Note that FIG. 1A corresponds to a cross-sectional view taken along the A-A line of FIG. 2A.

Returning to FIG. 1A, the square frame groove 13 features a width $W_1$ falling within a range from approximately 4 to 6 µm, and a depth D of at most 1 µm for the reasons stated in detail hereinafter.

Note, while the formation of the square frame groove 13 in the semiconductor substrate 11 is carried out, a plurality of via holes are simultaneously formed in the not-illustrated part of the semiconductor substrate 11 to obtain electrical contacts with the aforesaid various semiconductor elements, and a diameter of the via holes is considerably smaller in comparison with the width $W_1$ of the square frame groove 13.

Figure 1B:
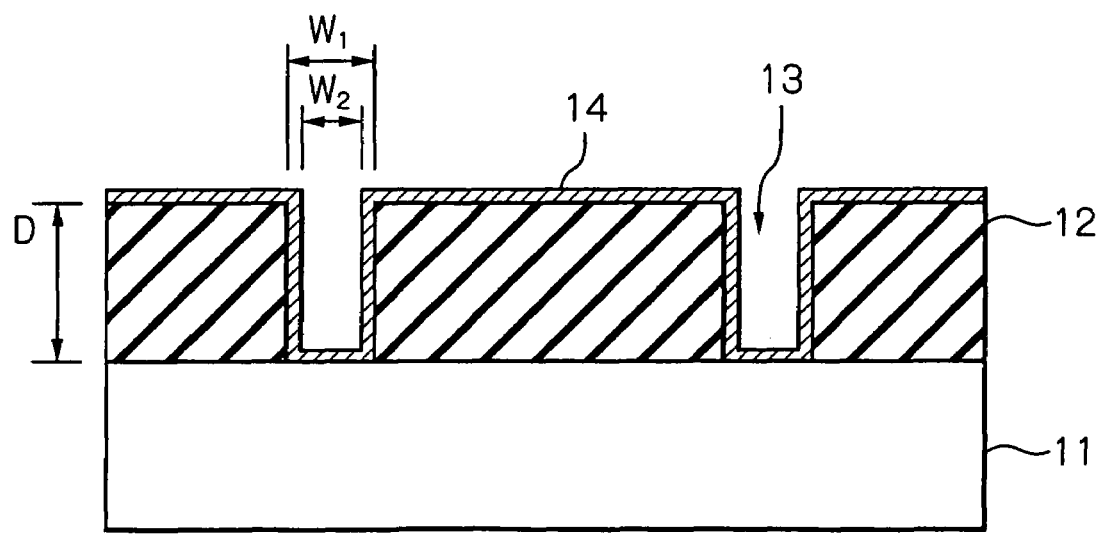

Next, referring to FIG. 1B, tungsten (W) is deposited on the silicon dioxide layer 12 by using a sputtering process to thereby form a tungsten layer 14 on the silicon dioxide layer 12 such that the square frame groove 13 is traversed with the tungsten layer 14. On the other hand, the aforesaid via holes are completely stuffed with tungsten, because the diameter of the via holes is considerably smaller in comparison with the width $W_1$ of the square frame groove 13, as stated above.

In short, the inner wall faces of the square frame groove 13 are covered with the tungsten layer 14 without being stuffed with tungsten, so that the width $W_1$ of the square frame groove 13 is narrowed to a width $W_2$ due to the thickness of the tungsten layer 14. Usually, the thickness of the tungsten layer 14 may fall within a range from approximately 0.3 to 0.5 µm. Thus, the narrowed width $W_2$ of the square frame groove 13 is calculated as follows:

$$W_2 = W_1 - 2 \cdot T$$

where T is the thickness of the tungsten layer 14.

Thus, the narrowed width $W_2$ of the square frame groove 13 falls within a range from approximately 3 to 5 µm.

Note, as a substitute for the tungsten layer 14, another metal layer, which is composed of tungsten (W) alloy, copper (Cu), copper (Cu) alloy, tantalum (Ta), tantalum (Ta) alloy, phosphorus-doped polycrystalline silicon or the like, may be utilized.

Figure 1C:
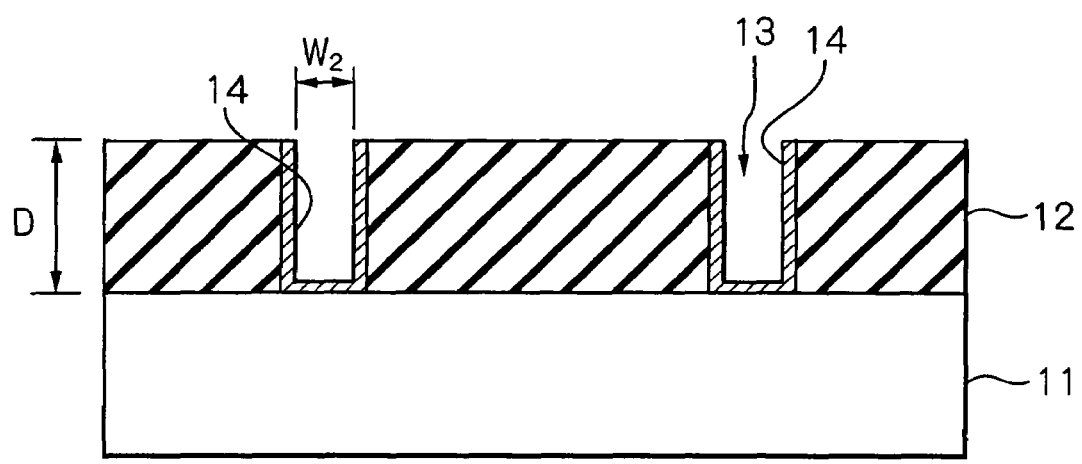

Next, referring to FIG. 1C, the tungsten layer 14 is subjected to a chemical mechanical polishing (CMP) process in which the redundant tungsten material is removed from the top surface of the silicon dioxide layer 12, so that the portion of the tungsten layer 14, which is formed on the inner wall faces of the square frame groove 13, remains as it stands, and so that the tungsten materials, with which the aforesaid via holes are stuffed, remain as tungsten via plugs which are electrically connected to the semiconductor elements formed in the semiconductor substrate 11.

During the CMP process, the tungsten layer 14 is polished, using an aqueous abrasive slurry. Thus, when the CMP process is completed, the top surface of the silicon dioxide layer 12 is polluted with the residual abrasive slurry, and a part of the residual abrasive slurry is stuffed into the square frame groove 13. The residual abrasive slurry contains various substances, such as abrasives, silicon-dioxide crumbs, organic crumbs and so on. Note, the organic crumbs are derived from a polishing cloth or pad composed of a suitable synthetic resin material, and a plastic retainer ring for retaining the polishing cloth or pad, which are used in the CMP process.

Thus, after the completion of the CMP process, the semiconductor device (wafer) is washed with a suitable aqueous washing solution, and is then rinsed with pure water. At this time, it is possible to substantially completely wash out the stuffed residual abrasive slurry from the square frame groove 13 as long as the square frame groove 13 features the width $W_2$ falling within the range from approximately 3 to 5 μm.

Figure 1D:
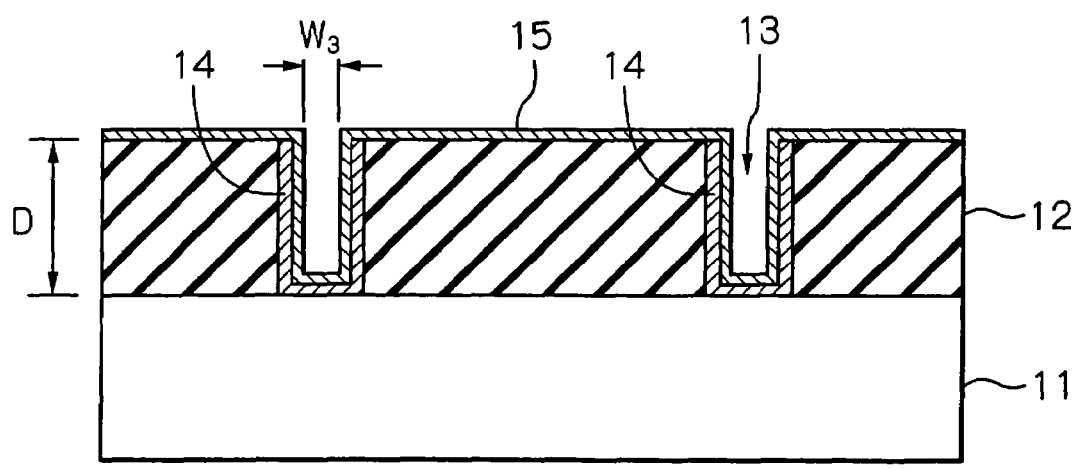

Next, referring to FIG. 1D, aluminum (Al) is deposited on the silicon dioxide layer 12 by using a sputtering process to thereby form an aluminum layer 15 on the silicon dioxide layer 12, such that the square frame groove 13, which is defined by the tungsten layer 14, is traversed with the aluminum layer 15. On the other hand, the aluminum layer 15 is in electrical contact with the tungsten via plugs formed in the aforesaid via holes.

In short, the inner wall faces of the square frame groove 13 are covered with the aluminum layer 15 without being stuffed with aluminum, so that the width $W_2$ (see: FIG. 1C) of the square frame groove 13 is further narrowed to a width $W_3$ due to a thickness of the aluminum layer 15. As a result, the square frame groove 13 featuring the width $W_3$ is defined as the lower mark element.

Note, as a substitute for the aluminum layer 15, another metal layer, which is composed of copper (Cu), titanium (Ti) or the like, may be utilized.

Figure 1E:
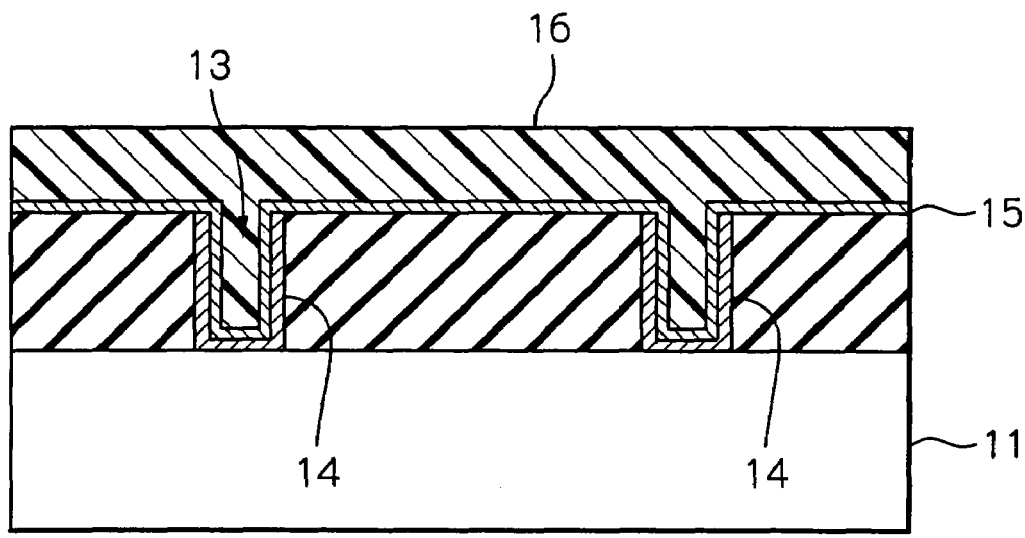

Next, referring to FIG. 1E, the aluminum layer 15 is coated with a suitable photoresist material by using a spin-coat process to thereby form a photoresist layer 16 is on the aluminum layer 15 so that the square frame groove 13 is stuffed with the photoresist material.

Figure 2B:
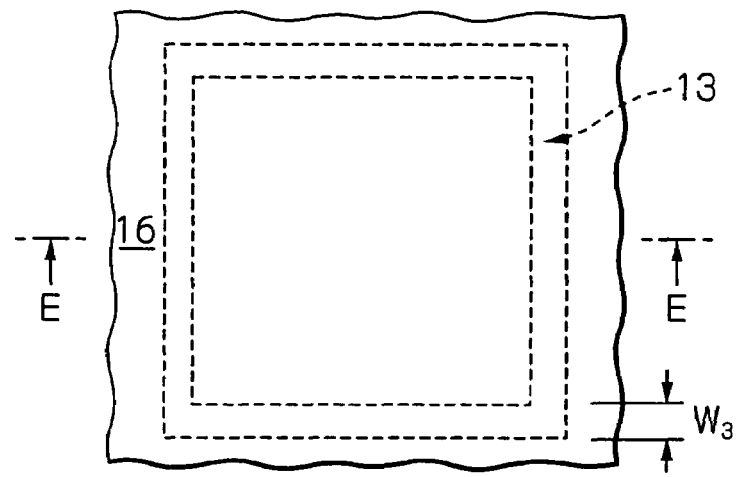
FIG. 2B is a partial plan view of FIG. 1E.

As shown in FIG. 2B which is a partial plan view of FIG. 1E, the square frame groove or lower mark element 13 is viewable due to a transparency of the photoresist layer 16. Note, FIG. 1E corresponds to a cross-sectional view taken along the E-E line of FIG. 2B.

After the formation of the photoresist layer 16, the semiconductor device (wafer) is transferred to a stepper including an alignment mark detection apparatus and an optical exposure apparatus. First, the semiconductor device (wafer) is set in the alignment mark detection apparatus in which an alignment mark detection process is executed. Namely, an alignment mark element (not shown), which is previously formed on the semiconductor substrate 11, is optically detected by using a charge-coupled device (CDD) image sensor, and a position of the detected alignment mark element is calculated as positional data with respect to a suitable coordinate system defined on the semiconductor substrate 11.

Then, the semiconductor device (wafer) is set in the optical exposure apparatus, which includes an optical projector unit having a photomask or reticle for generating an upper mark image and a wiring pattern image, and a movable stage associated with the optical projector unit. In the optical exposure apparatus, the semiconductor device (wafer) is rested on the movable stage, and is positioned with respect to the optical projector unit based on the positional data obtained by the alignment mark detection process. Then, an exposure process is carried out such that both the upper mark image and the wiring pattern image are optically projected on the photoresist layer 16 with an ultraviolet ray, by using the photomask or reticle.

Figure 1F:
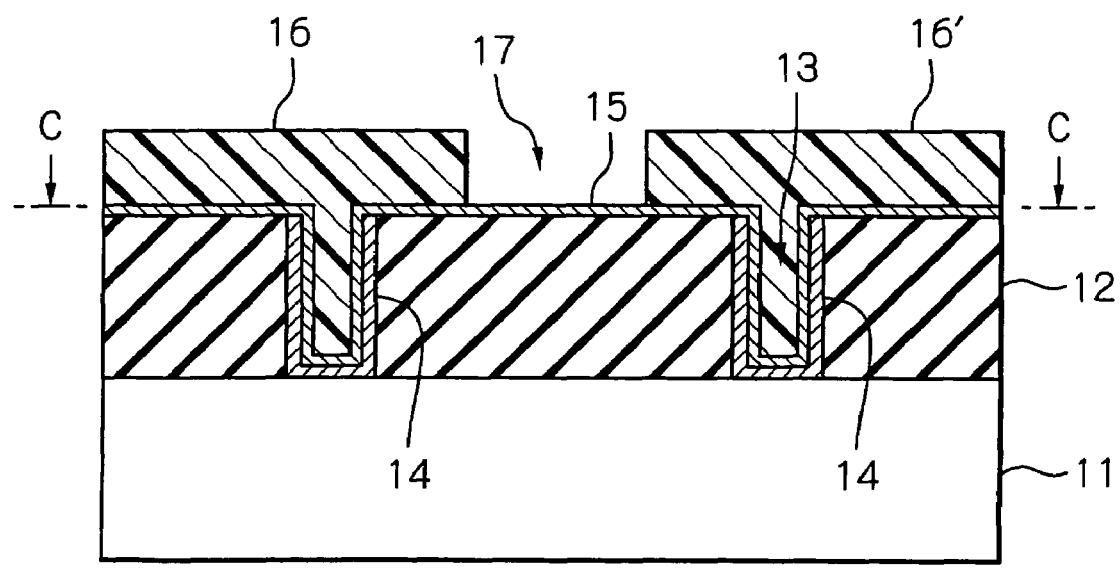

Next, referring to FIG. 1F, the photoresist layer 16 is subjected to a developing process in which the exposed portions of the photoresist layer 16 are removed from the photoresist layer 16 by using a suitable organic solvent, so that the remaining portions or not exposed portions of the photoresist layer 16 are left as a photoresist pattern 16' on the aluminum layer 15.

The photoresist pattern 16' has a plurality of openings (not shown) formed therein, and these openings are derived from the aforesaid wiring pattern image. Namely, a configuration of all the openings corresponds to a wiring pattern (not shown) to be formed in the aluminum layer 15.

Also, the photoresist pattern 16' has an opening 17 formed therein, and the opening 17 is derived from the aforesaid upper mark image, and serves as an upper mark element which defines an overlay mark in conjunction with the square frame groove or lower mark element 13.

Figure 2C:
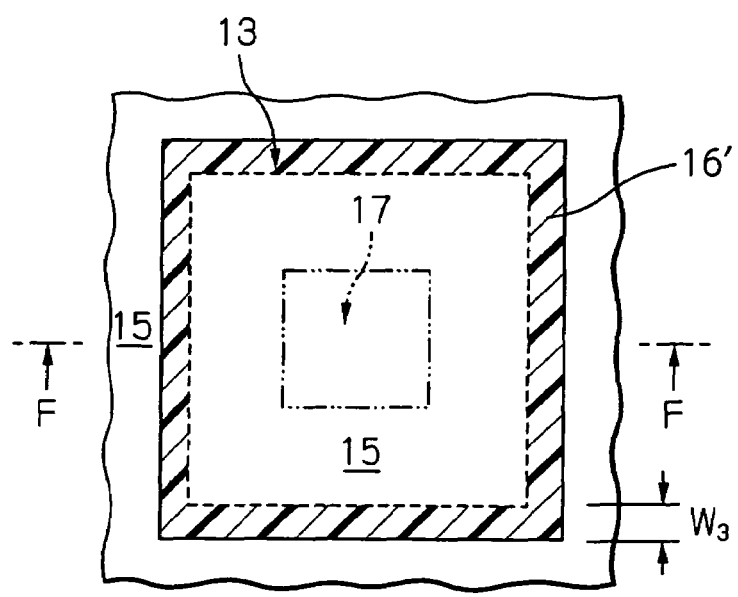
FIG. 2C is a partial cross-sectional plan view taken along the C-C line of FIG. 1F.

As shown in FIG. 2C which is a partial cross-sectional plan view taken the C-C line of FIG. 1F (FIG. 2C corresponds to a cross-sectional view taken along the F-F line of FIG. 2C), the opening or upper mark element 17, which is drawn by a phantom line, has a square configuration, and is located at an area encompassed by the lower mark element (square frame groove) 13.

In short, the overlay mark is defined as being composed of the lower mark element 13 formed as the square frame groove 13 in the silicon dioxide layer 12, and the upper is mask element 17 formed as the square opening in the photoresist layer 16.

Then, the semiconductor device (wafer) is set in a discrepancy evaluation apparatus in which a discrepancy evaluation process is executed to evaluate whether or not a discrepancy is produced in the overlay mark (13, 17), as stated in detail hereinafter.

FIG. 3 shows a flowchart of the process executed in the stages of FIGS. 1E and 1F.

At step 301, the alignment mark detection process is executed in the alignment mark detection apparatus, and the positional data of the alignment mark element (not shown) is calculated by detecting the alignment mark element with the CCD image sensor, as explained with reference to FIG. 1E.

At step 302, the exposure process is executed in the optical exposure apparatus. Namely, the semiconductor device (wafer) rested on the movable stage is positioned with respect to the optical projector unit based on the positional data obtained by the alignment mark detection process, and then both the upper mark image and the wiring pattern image are optically projected on the photoresist layer 16 with the ultraviolet ray, by using the photomask or reticle, as explained with reference to FIG. 1E.

At step 303, the developing process is executed, and the photoresist layer 16 is defined as the photoresist pattern 16', as explained with reference to FIG. 1F.

At step 304, the discrepancy evaluation process is executed in the discrepancy evaluation apparatus. In particular, the discrepancy evaluation apparatus includes a CCD image sensor, and the overlay mark (13, 17) is scanned with the CCD image sensor to thereby detect a discrepancy between the center of the lower mark element 13 and the center of the upper mark element 17.

At step 305, it is determined whether the discrepancy falls within a permissible range by using an microcomputer incorporated in the discrepancy evaluation apparatus. Note, although the photoresist pattern 16' should be precisely positioned with respect to an arrangement of the tungsten via plugs due to the positional data of the alignment mark element, in reality, the discrepancy may be produced between the wiring pattern image and the arrangement of the tungsten via plugs.

When the discrepancy falls within the permissible range, at step 305, the semiconductor device (wafer) is subjected to an etching process in which the aluminum layer 15 is etched, using the photoresist pattern 16', so that the wiring pattern (not shown) is formed in the aluminum layer 15.

At this time, an opening corresponding to the upper mark element or square opening 17 is formed on the aluminum layer 15.

Note, as not illustrated, after the etching process is completed, an insulating layer is further formed on the insulating layer 12 as an insulating interlayer forming a part of the multi-layered wiring structure, and a lower mark element is formed in the insulating interlayer in substantially the same manner as explaining with reference to FIGS. 1A and 1F.

On the other hand, when the discrepancy does not fall within the permissible range, the photoresist pattern 16' is removed from the aluminum layer 15. Then, a photoresist layer (16) is again formed on the aluminum layer 15, and is again subjected to the processes of steps 301 to 304.

Incidentally, as explained with reference to FIG. 1C, when the CMP process is completed, the top surface of the silicon dioxide layer 12 is polluted with the residual abrasive slurry containing the various substances, such as the abrasives, the silicon-dioxide crumbs, the organic crumbs and so on, and the part of the residual abrasive slurry is stuffed into the square frame groove 13. Accordingly, after the completion of the CMP process, the semiconductor device (wafer) is washed with an aqueous washing solution, and is then rinsed with pure water.

In this case, the width $W_2$ of the lower mark element or square frame groove 13 is a significant factor for substantially completely removing the stuffed residual abrasive slurry from the square frame groove 13. Namely, when the width $W_2$ of the square frame groove 13 is too small, the square frame groove 13 is clogged with the various substances.

When the square frame groove 13 is clogged with the various substances, it is difficult to properly evaluate the discrepancy of the overlay mark (13, 17), because the clogged substances cause noises when the overlay mark (13, 17) is scanned with the CCD image sensor of the discrepancy evaluation apparatus.

Thus, the inventor carried out experiments to investigate relationships between the width $W_1$ of the square frame groove 13 and the clogged substances.

In the experiments, a plurality of silicon wafer samples were prepared, and a silicon dioxide layer (12) was formed on each of the silicon wafer samples. Then, each of the silicon dioxide layers (12) was formed with five square frame grooves (13), and a tungsten layer (15) was formed thereon, as shown in FIG. 1B. At this time, the five square frame grooves (13) featured one of depths D of 0.4, 1.0, 2.0, 3.0 and 4.0 μm, and one of widths $W_1$ of 40.0, 20.0, 8.8, 8.0, 6.0, 4.0, 3.0, 2.0, 1.5, 1.0 and 0.5 μm. Also, in each of the silicon wafer samples, one of the five square frame grooves (13) was located at the center of the silicon wafer sample concerned, and the remaining four square frame grooves (13) were located at the respective four ends of a cross defined at the center of the silicon wafer sample.

Then, each of the silicon dioxide layers (12) was polished by using a CMP process. Thereafter, the silicon dioxide layer (12) concerned was washed with an aqueous washing solution, and was rinsed with the pure water.

Figure 4:
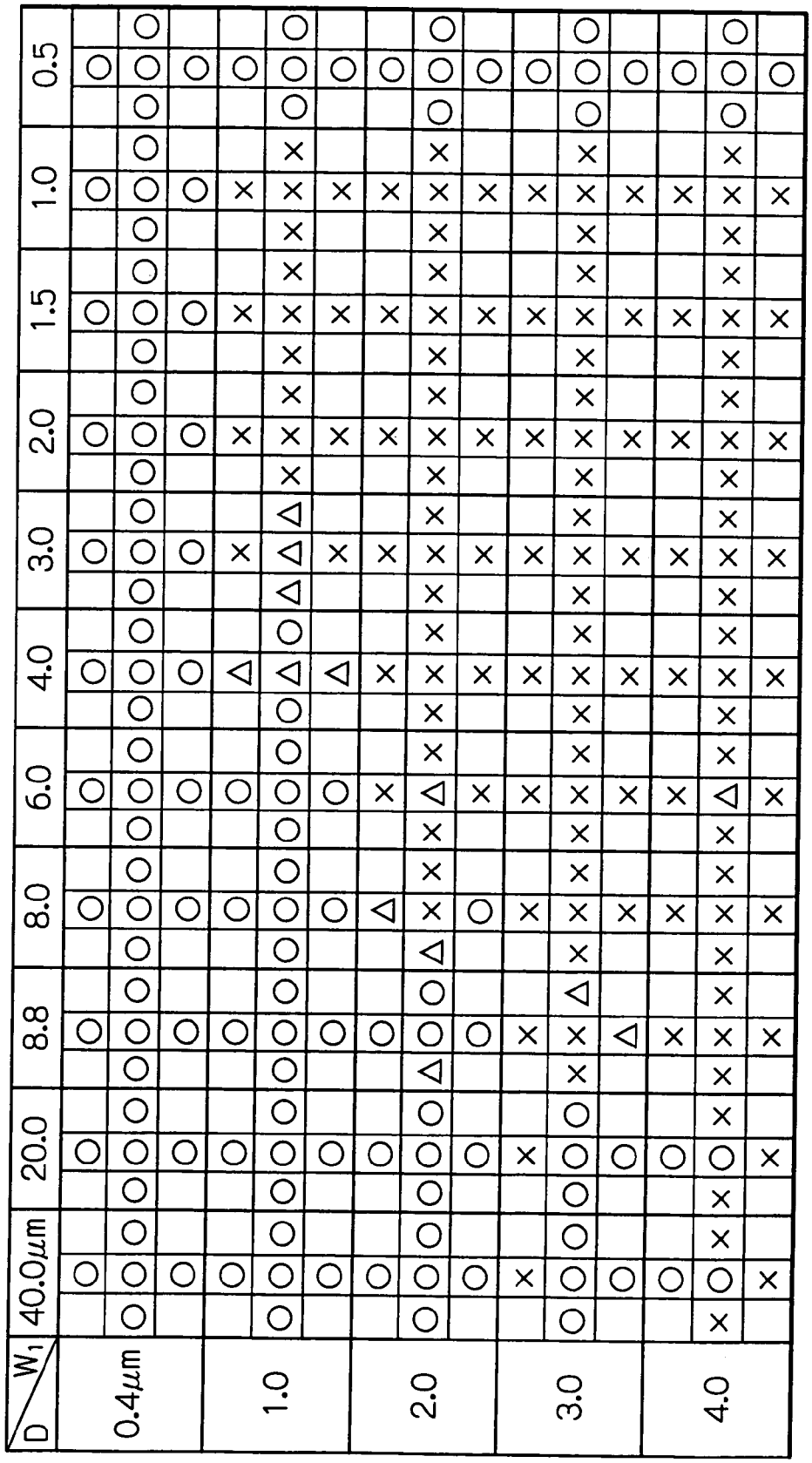
FIG. 4 is a table showing the results of the experiments carried out by the inventor.

The experimental results are shown in a table of FIG. 4. In this table; symbol ○ represents that the stuffed abrasive slurry could be substantially completely removed together with the various substances from the square frame groove (13) concerned; symbol Δ represents that a small amount of the various substances were left in the square frame groove (13) concerned, but it did not exert a bad influence on the extraction of the image of the square frame groove or lower mark element 13 by the labeling process; and symbol × represents that the square frame groove 13 concerned was clogged with the various substances, especially the organic crumbs derived from the aforesaid plastic retainer ring, resulting in failure to properly extract the image of the square frame groove or lower mark element 13 by the labeling process.

For example, in the silicon wafer sample having the five square frame grooves (13) featuring the depth D of 0.4 μm and the width $W_1$ of 4.0 μm, it was possible to substantially completely remove the stuffed abrasive slurry together with the various substances from all the five square frame grooves (13).

Also, in the silicon wafer sample having the five square frame grooves (13) featuring the depth D of 1.0 μm and the width $W_1$ of 4.0 μm, it was possible to substantially completely remove the stuffed abrasive slurry together with the various substances from only the two square frame grooves (13) located at the right and left ends of the cross. Namely, the small amounts of the various substances were left in the respective three square frame grooves (13) located at the center, upper and lower ends of the cross.

Referring to FIGS. 5A through 5H, the above-mentioned experimental results are visually and representatively shown by way of example.

In FIGS. 5A through 5D, the four square frame grooves (13) featured the depth D of at most 1.0 μm and the respective widths $W_1$ falling within a range from 0.1 to 20 μm.

As shown in FIG. 5A, when the square frame groove (13) had the width $W_1$ falling within the range from 0.1 to 2.0 μm, the square frame groove (13) concerned was clogged with an organic crumb 18 derived from the aforesaid plastic retainer ring, and was evaluated by the symbol ×.

Similarly, as shown in FIG. 5B, when the square frame groove (13) had the width $W_1$ falling within the range from 2.0 to 4.0 μm, the square frame groove (13) concerned was clogged with an organic crumb 18 derived from the plastic retainer ring, and was evaluated by the symbol ×.

As shown in FIG. 5C, when the square frame groove (13) had the width $W_1$ falling within the range from 4.0 to 6.0 μm, an abrasive slurry 19 and silicon-dioxide crumbs 20 were left in the square frame groove (13) concerned, and thus this square frame groove was evaluated as represented by the symbol Δ.

Similarly, as shown in FIG. 5D, when the square frame groove (13) had the width $W_1$ falling within the range from 6.0 to 20 μm, an abrasive slurry 19 and silicon-dioxide crumbs were left in the square frame groove (13) concerned, and thus this square frame groove was evaluated as represented by the symbol ○. Nevertheless, the square frame groove having the width $W_1$ of more than 6.0 μm should be not used because it is difficult to properly evaluate the discrepancy of the overlay mark (13, 17). Namely, when the width of the square frame groove is too wide, an amount of noises becomes larger when the overlay mark (13, 17) is scanned with the CCD image sensor of the discrepancy evaluation apparatus, resulting in exertion of a bad influence on the evaluation of the discrepancy between the lower mark element and the upper mark element.

In FIGS. 5E through 5H, the four square frame grooves (13) featured the depth D of at least 2.0 μm and the respective widths $W_1$ falling within a range from 0.1 to 20 μm.

As shown in FIG. 5E, when the square frame groove (13) had the width $W_1$ falling within the range from 0.1 to 2.0 μm, the square frame groove (13) concerned was clogged with an organic crumb 18 derived from the plastic retainer ring, and was evaluated by the symbol ×.

Similarly, as shown in FIG. 5F, when the square frame groove (13) had the width $W_1$ falling within the range from 2.0 to 4.0 μm, the square frame groove (13) concerned was clogged with an organic crumb 18 derived from the plastic retainer ring, and was evaluated by the symbol ×.

As shown in FIG. 5G, when the square frame groove (13) had the width $W_1$ falling within the range from 4.0 to 6.0 μm, the square frame groove (13) concerned was clogged with an organic crumb 18 derived from the plastic retainer ring, and an abrasive slurry 19 and silicon-dioxide crumbs 20 were left in the square frame groove (13) concerned. This state was evaluated as represented by the symbol ×.

Similarly, as shown in FIG. 5H, when the square frame groove (13) had the width $W_1$ falling within the range from 6.0 to 20 μm, the square frame groove (13) concerned was partially clogged with an organic crumb 18 derived from the plastic retainer ring, and an abrasive slurry 19 and silicon-dioxide crumbs 20 were left in the square frame groove (13) concerned. This state was also evaluated as represented by the symbol ×.

Figure 6:
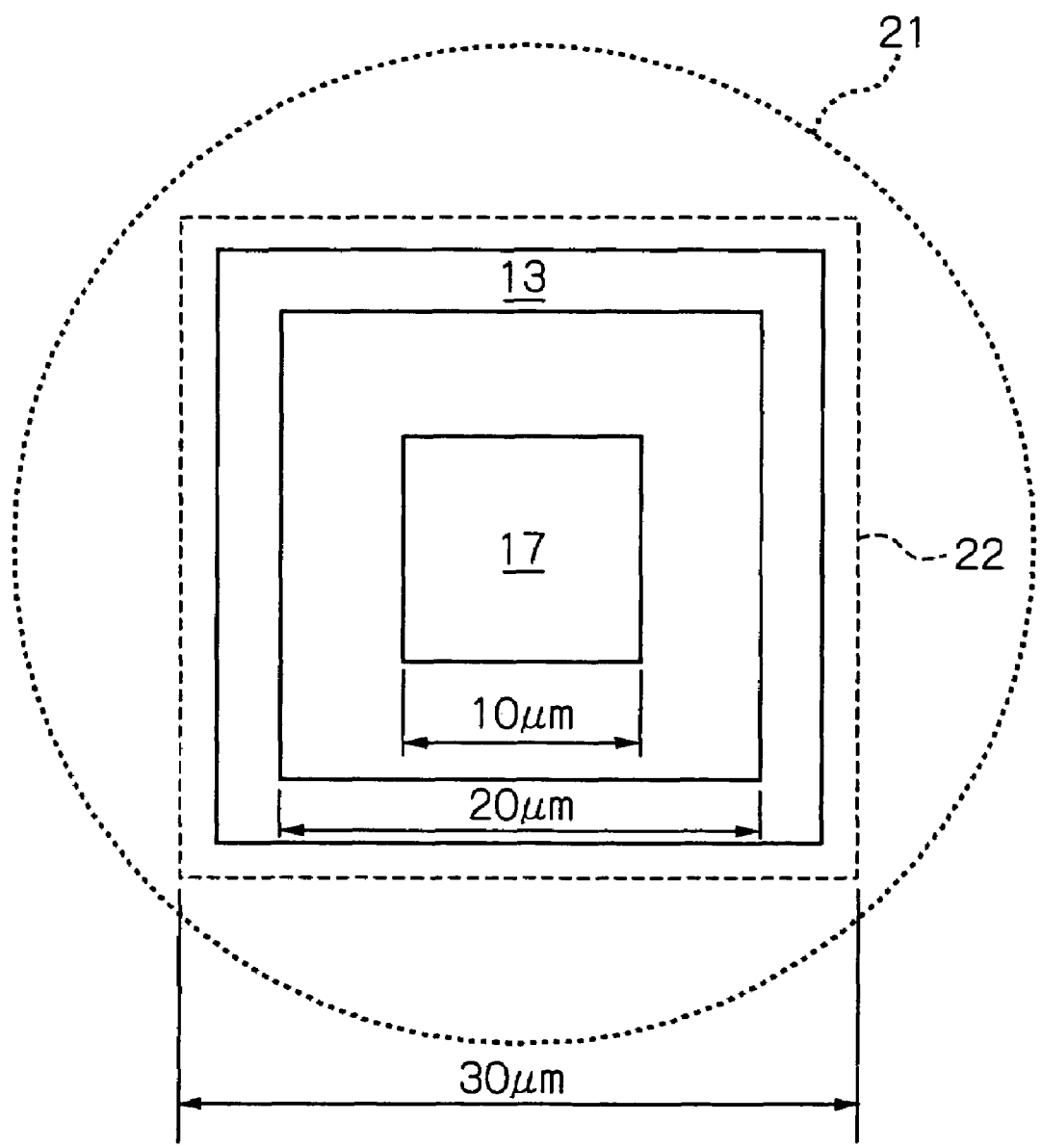
FIG. 6 is an explanatory view showing a circular effective sight area of a charge-coupled device (CCD) image sensor for detecting the lower mark element formed by the method of FIGS. 1A to 1F.

Referring to FIG. 6, reference 21 indicates a circular effective sight area which can be photographed by the CCD image sensor of the discrepancy evaluation apparatus, and reference 22 indicates a detectable square area which is defined within the circular effective sight area 21 to detect the square frame groove or lower mark element 13. Usually, a side dimension of the detectable square area 22 is on the order of 30 μm, and thus a side dimension of the lower mark element 13 should be less than 30 μm. For example, when the side dimension of the lower mark element 13 is 30 μm, and a side dimension of the square opening or positioning-evaluation mark element 17 may be on the order of 10 μm.

Accordingly, the original width $W_1$ (see: FIG. 1A) of the square frame groove 13 is restricted by both the dimension of the detectable square area 22 and the dimension of the positioning-evaluation mark element 17. Namely, the width $W_2$ of the square frame groove 13 is too large, e.g. when the width $W_2$ of the square frame groove 13 exceeds 6 μm, it is difficult to accommodate the square frame groove 13 within the detectable square area 22.

Thus, as explained with reference to FIG. 1A, the original width $W_1$ of the square frame groove 13 should fall within the range from approximately 4 to approximately 6 μm, i.e., as explained with reference to FIG. 1B, the narrowed width $W_2$ of the square frame groove 13 should fall within the range from approximately 3 to 5 μm.

Figure 7A:
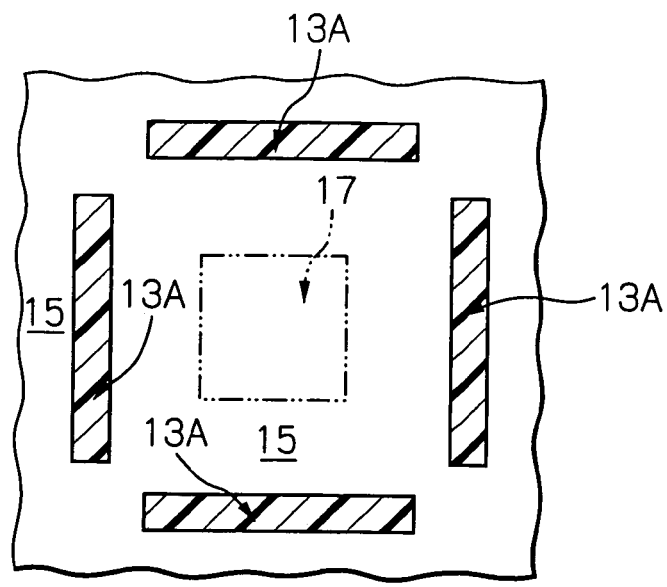
FIGS. 7A to 7C are partial cross-sectional plan views, each corresponding to FIG. 2C, showing first, second and third modifications of the lower mark element formed by the method of FIGS. 1A to 1F.

Referring to FIG. 7A corresponding to FIG. 2C, a first modification of the lower mark element 13 is illustrated. In this first modification, a square-like or incomplete square groove or lower mark element is substituted for the lower mark element 13 (see: FIGS. 1A through 1F). Namely, the incomplete square lower mark element is defined by four elongated groove segments 13A which are formed in the silicon dioxide layer 12, and which are arranged along the respective sides of a square.

Figure 7B:
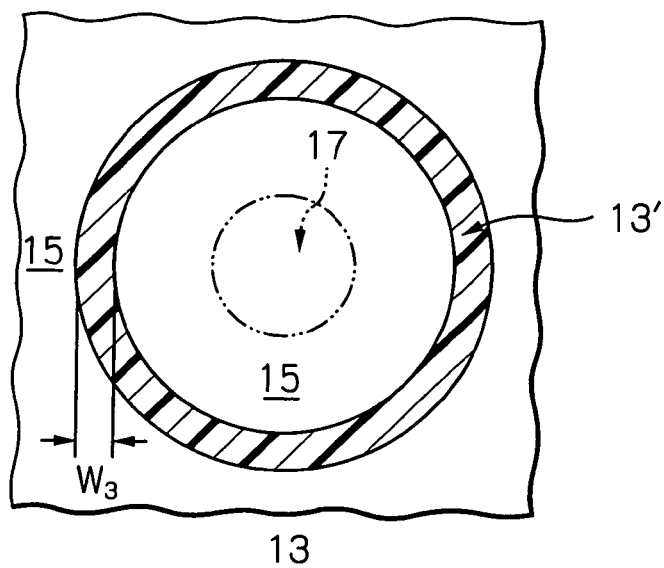

Referring to FIG. 7B corresponding to FIG. 2C, a second modification of the lower mark element 13 is illustrated. In this second modification, a circular lower mark element is substituted for the square lower mark element 13 (see: FIGS. 1A through 1F). Namely, the circular lower mark element is defined as a circular frame groove 13' which is formed in the silicon dioxide layer 12.

Figure 7C:
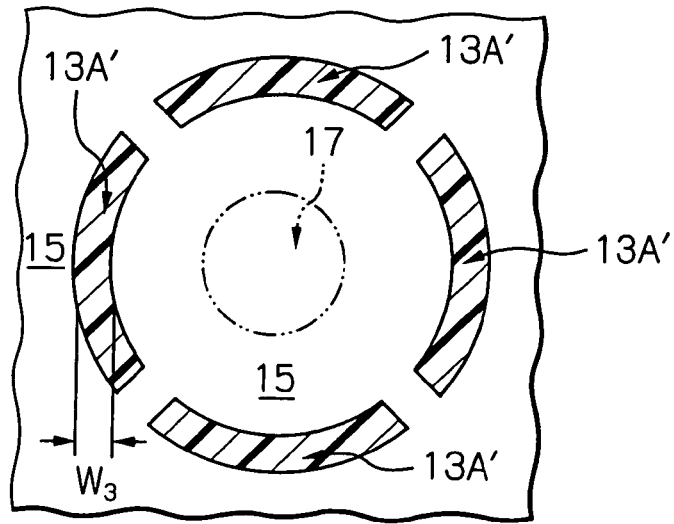

Referring to FIG. 7C corresponding to FIG. 2C, a third modification of the lower mark element 13 is illustrated. In this third modification, a circular-like or incomplete circular lower mark element is substituted for the square lower mark element 13 (see: FIGS. 1A through 1F). Namely, the incomplete circular lower mark element is defined by four arch groove segments 13A' which are formed in the silicon dioxide layer 12, and which are arranged along a circular.

Furthermore, a lower mark element featuring another configuration, such as a polygon, a rectangle, an oval or the like, may be substituted for the square lower mark element 13.

Finally, it will be understood by those skilled in the art that the foregoing description is of preferred embodiments of the devices, and that various changes and modifications may be made to the present invention without departing from the spirit and scope thereof.

The invention claimed is:

1. A semiconductor device comprising:
    an insulating layer formed on a substrate;
    a wiring pattern layer formed on said insulating layer; and
    a lower mark element defined as a groove formed in said insulating layer, said lower mark element defining an overlay mark in conjunction with an upper mask element formed in a photoresist pattern coated on said insulating layer for the formation of said wiring pattern layer,
    wherein said lower mark element features a width falling within a range from approximately 4 to 6 μm, and a depth of at most 1 μm.

2. The semiconductor device as set forth in claim 1, wherein said groove has a polygonal frame configuration when viewed from a location above a top surface of said insulating layer.

3. The semiconductor device as set forth in claim 2, wherein said polygonal frame configuration is defined as a square frame configuration.

4. The semiconductor device as set forth in claim 1, wherein said groove has an incomplete square frame configuration when viewed from a location above a top surface of said insulating layer.

5. The semiconductor device as set forth in claim 1, wherein said groove has a circular frame configuration when viewed from a location above a top surface of said insulating layer.

6. The semiconductor device as set forth in claim 1, wherein said groove has an incomplete circular frame configuration when viewed from a location above a top surface of said insulating layer.

7. The semiconductor device as set forth in claim 1, further comprising a metal layer formed on inner wall faces of said groove so that the width of said groove are narrowed due to a thickness of said metal layer, the narrowed groove falling within a range from approximately 3 to 5 µm.

8. The semiconductor device as set forth in claim 7, wherein said metal layer is composed of one selected from a group consisting of tungsten (W), tungsten (W) alloy, copper (Cu), copper (Cu) alloy, tantalum (Ta), tantalum (Ta) alloy and phosphorus-doped polycrystalline silicon.

9. The semiconductor device as set forth in claim 7, wherein said metal layer is defined as a first metal layer, said semiconductor device further comprising a second metal layer formed on a top surface of said insulating layer so that said narrowed groove is traversed with said second metal layer.

10. The semiconductor device as set forth in claim 9, wherein said second metal layer is composed of one selected from a group consisting of aluminum (Al), copper (Cu) and titanium (Ti).

11. A semiconductor device comprising:

an insulating layer formed on a substrate;

a lower mark element defined as a groove formed in said insulating layer;

a metal layer formed on said insulating layer;

a photoresist pattern formed on said metal layer; and an upper mark element defined as an opening formed in said photoresist pattern, both said lower mark element and said upper mark element defining an overlay mark in conjunction with each other, wherein said lower mark element features a width falling within a range from approximately 4 to 6 µm, and a depth of at most 1 µm.

12. The semiconductor device as set forth in claim 11, wherein said groove has a polygonal frame configuration when viewed from a location above a top surface of said insulating layer.

13. The semiconductor device as set forth in claim 12, wherein said polygonal frame configuration is defined as a square frame configuration.

14. The semiconductor device as set forth in claim 11, wherein said groove has an incomplete square frame configuration when viewed from a location above a top surface of said insulating layer.

15. The semiconductor device as set forth in claim 11, wherein said groove has a circular frame configuration when viewed from a location above a top surface of said insulating layer.

16. The semiconductor device as set forth in claim 11, wherein said groove has an incomplete circular frame configuration when viewed from a location above a top surface of said insulating layer.

17. The semiconductor device as set forth in claim 11, wherein said groove is traversed with said metal layer so that the width of said groove are narrowed due to a thickness of said metal layer, the narrowed groove falling within a range from approximately 3 to 5 µm.

18. The semiconductor device as set forth in claim 17, wherein said metal layer is composed of one selected from a group consisting of tungsten (W), tungsten (W) alloy, copper (Cu), copper (Cu) alloy, tantalum (Ta), tantalum (Ta) alloy and phosphorus-doped polycrystalline silicon.

19. The semiconductor device as set forth in claim 17, wherein said metal layer is defined as a first metal layer, said semiconductor device further comprising a second metal layer formed on a top surface of said insulating layer so that said narrowed groove is traversed with said second metal layer.

20. The semiconductor device as set forth in claim 19, wherein said second metal layer is composed of one selected from a group consisting of aluminum (Al), copper (Cu) and titanium (Ti).

* * * * *